United States Patent
Zolfaghari

(10) Patent No.: US 7,459,976 B2
(45) Date of Patent: Dec. 2, 2008

(54) APPARATUS AND METHOD FOR BIASING CASCODE DEVICES IN A DIFFERENTIAL PAIR USING THE INPUT, OUTPUT, OR OTHER NODES IN THE CIRCUIT

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/889,992

(22) Filed: Aug. 17, 2007

(65) Prior Publication Data

US 2008/0024219 A1 Jan. 31, 2008

Related U.S. Application Data

(63) Continuation of application No. 11/086,920, filed on Mar. 23, 2005, now Pat. No. 7,259,626.

(60) Provisional application No. 60/639,304, filed on Dec. 28, 2004.

(51) Int. Cl.
*H03F 3/45* (2006.01)
(52) U.S. Cl. ..................................... 330/253
(58) Field of Classification Search .................. 327/539, 327/359; 330/259
See application file for complete search history.

(56) References Cited

U.S. PATENT DOCUMENTS

| | | | | |
|---|---|---|---|---|
| 4,340,866 A | * | 7/1982 | Metz | 330/254 |
| 5,576,616 A | * | 11/1996 | Ridgers | 323/314 |
| 6,480,066 B1 | * | 11/2002 | Madni | 330/254 |
| 6,515,547 B2 | | 2/2003 | Sowlati | |
| 6,710,641 B1 | * | 3/2004 | Yu et al. | 327/539 |
| 6,806,776 B2 | | 10/2004 | Lee et al. | |

FOREIGN PATENT DOCUMENTS

JP 63030012 A * 2/1988

OTHER PUBLICATIONS

Razavi, "Design of Analog CMOS Integrated Circuits," McGraw-Hill, Inc., Copyright, 2001, pp. 383-386.

* cited by examiner

*Primary Examiner*—Robert J. Pascal
*Assistant Examiner*—Alan Wong
(74) *Attorney, Agent, or Firm*—Sterne, Kessler, Goldstein & Fox P.L.L.C.

(57) ABSTRACT

A differential amplifier is configured in a cascode configuration that includes input transistors that are connected to corresponding cascode transistors. The gates of the cascode transistors are tied together to form a common bias for the cascode devices. The input transistors of the differential amplifier receive a differential input signal that is amplified and outputted to an output circuit that is connected to the cascode transistors. The cascode devices require a bias voltage for proper operation. Preferably, the bias voltage puts the cascode devices into the saturation region. The gates of cascode devices are coupled together and connected to a bias terminal. In embodiments of the invention, the bias terminal is connected to another terminal of the chip to provide the bias for the cascode devices. This can include the input and output nodes if they have a well-defined and relatively fixed voltage. In one embodiment, the output circuit includes a second stage amplifier that generates the DC voltage necessary to bias the cascode devices. In this way, there is no need for external bias circuitry.

5 Claims, 6 Drawing Sheets

US 7,459,976 B2

APPARATUS AND METHOD FOR BIASING CASCODE DEVICES IN A DIFFERENTIAL PAIR USING THE INPUT, OUTPUT, OR OTHER NODES IN THE CIRCUIT

This Application is a continuation of U.S. patent application Ser. No. 11/086,920, filed Mar. 23, 2005, which claims the benefit of U.S. Provisional Application No. 60/639,304, filed on Dec. 28, 2004, both of which are incorporated herein by reference in their entirety.

BACKGROUND OF THE INVENTION

1. Field of the Invention

The present invention generally relates to cascode devices, and more specifically to biasing cascode devices without an external biasing circuit.

2. Background Art

Communications circuits often include a differential configuration and differential amplifier to improve noise performance. Using a cascode configuration in a differential pair is a common practice. The advantages include, but not limited to, providing more isolation from the input to the output of the trans-conductor stage, higher impedance at the output of the input trans-conductor thereby boosting the gain, and protecting the drain of the input devices. As a result, the cascode configuration is quite popular in differential pairs. However, the cascode devices require a bias voltage. This is usually done by adding some circuitry particularly for this purpose which is undesirable for very low-power applications.

Therefore, what is needed is a cascode configuration in a differential amplifier with a low power bias circuit configuration.

BRIEF SUMMARY OF THE INVENTION

A differential amplifier is configured in a cascode configuration that includes input transistors that are connected to corresponding cascode transistors. Specifically, the drains of the input transistors are connected to corresponding sources of the cascode transistors. The gates of the cascode transistors are tied together to form a common bias for the cascode devices, and the drains are coupled to an output circuit. The differential amplifier receives a differential input signal for amplification and produces an amplified signal that coupled to the output circuit. The cascode devices provide more isolation from input to output, and a higher impedance at the output of the input devices, thereby boosting gain.

The cascode devices require a bias voltage for proper operation. Preferably, the bias voltage puts the cascode devices into the saturation region. The gates of cascode devices are coupled together and connected to a bias terminal. In embodiments of the invention, the bias terminal is connected to another terminal of the chip to provide the bias for the cascode devices. This can include the input and output nodes if they have a well-defined and relatively fixed voltage. In one embodiment, the output circuit includes a second stage amplifier that generates the DC voltage necessary to bias the cascode devices. In this way, there is no need for external bias circuitry.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
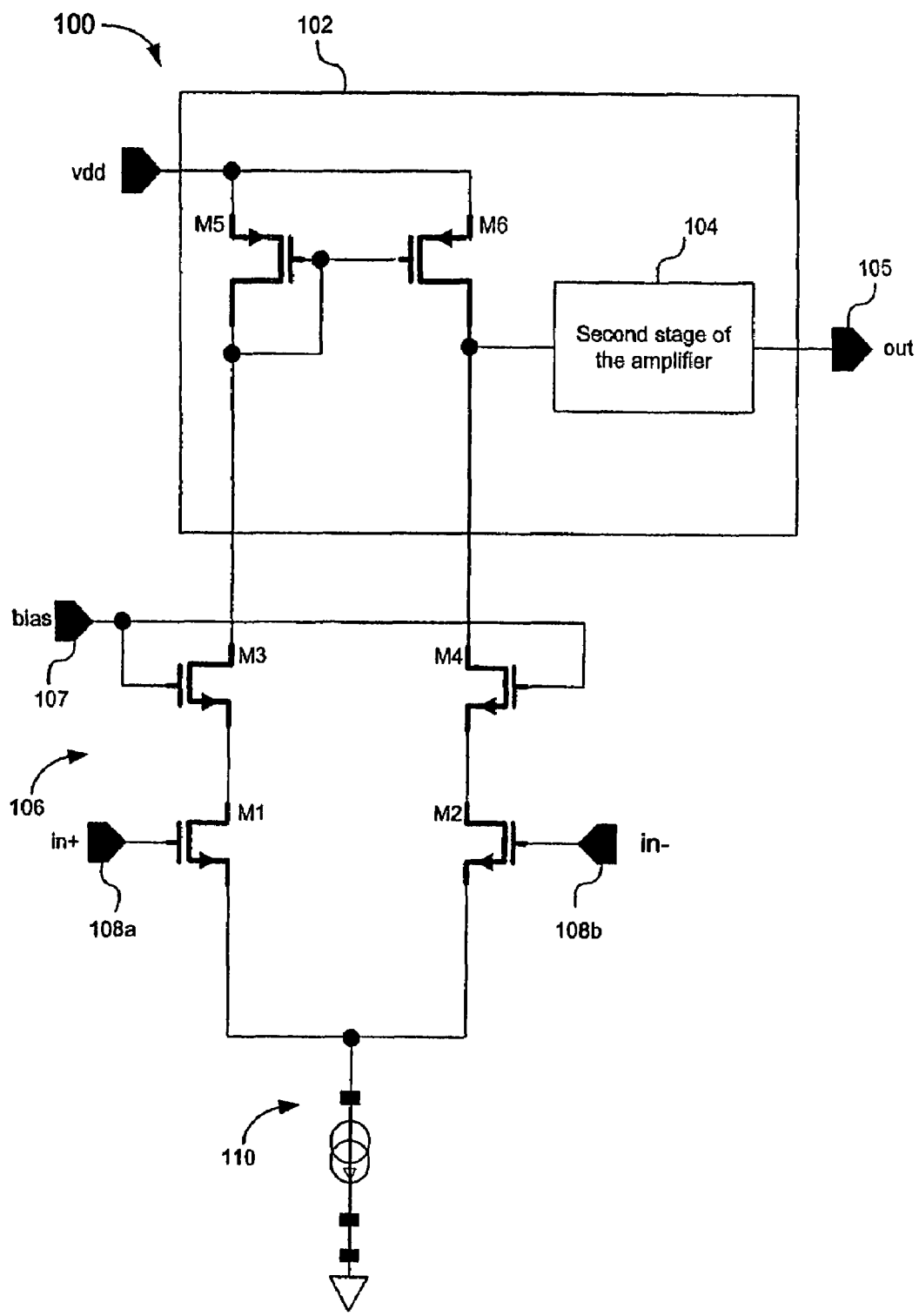
FIG. 1 illustrates a differential amplifier in a cascode configuration with a common bias terminal for the cascode devices according to embodiments of the present invention.

FIG. 1 illustrates a differential configuration 100 having a input differential amplifier 106 and an output circuit 102 that are implemented on a common substrate, for example a CMOS substrate according to embodiments of the present invention. The differential amplifier 106 and the output circuit 102 could also be referred to respectively as an input amplifier stage and an output amplifier stage, or first and second stages or circuits, for convenience.

The differential amplifier 106 is configured in a cascode configuration. Namely, the differential amplifier 106 includes input field effect transistors (FET) M1 and M2 that are connected to corresponding cascode devices M3 and M4. M3 and M4 are also FET devices that are cascode connected to the corresponding FET devices M1 and M2. Specifically, the drains of M1 and M2 are connected to the corresponding sources of M3 and M4. The gates of M3 and M4 are tied together and biased with bias node 107, such that the bias node 107 provides a gate bias for the cascode FET devices M3 and M4.

The input devices M1 and M2 receive a differential input signal at terminals 108a and 108b that is amplified and outputted to the output circuit 102. As discussed above, the cascode devices M3 and M4 provide more isolation from input to output, and a higher impedance at the output of the input devices M1 and M2, thereby boosting gain. The output circuit 102 includes transistors M5 and M6 that are connected to the cascode devices M3 and M4, where the output of the first stage of amplification is taken from the drain of M6. The drain of M6 is coupled to a second stage of amplification 104, the output of which is connected to the output terminal 105.

As discussed above, the cascode devices M3 and M4 require a bias voltage for proper operation. Preferably, the bias voltage puts M3 and M4 into the saturation region. The gates of cascode devices M3 and M4 are coupled together and connected to the bias terminal 107. In embodiments of the invention, the bias terminal 107 is connected to another terminal of the chip to provide the bias for the cascode devices M3 and M4. This can include the input and output nodes if they have a well-defined and relatively fixed voltage, or any other node in the circuit 100 if they a well-defined and relatively fixed voltage. Further, the two stage amplifier can be an operational amplifier that provides a well defined and relatively fixed output voltage.

Figure 2:
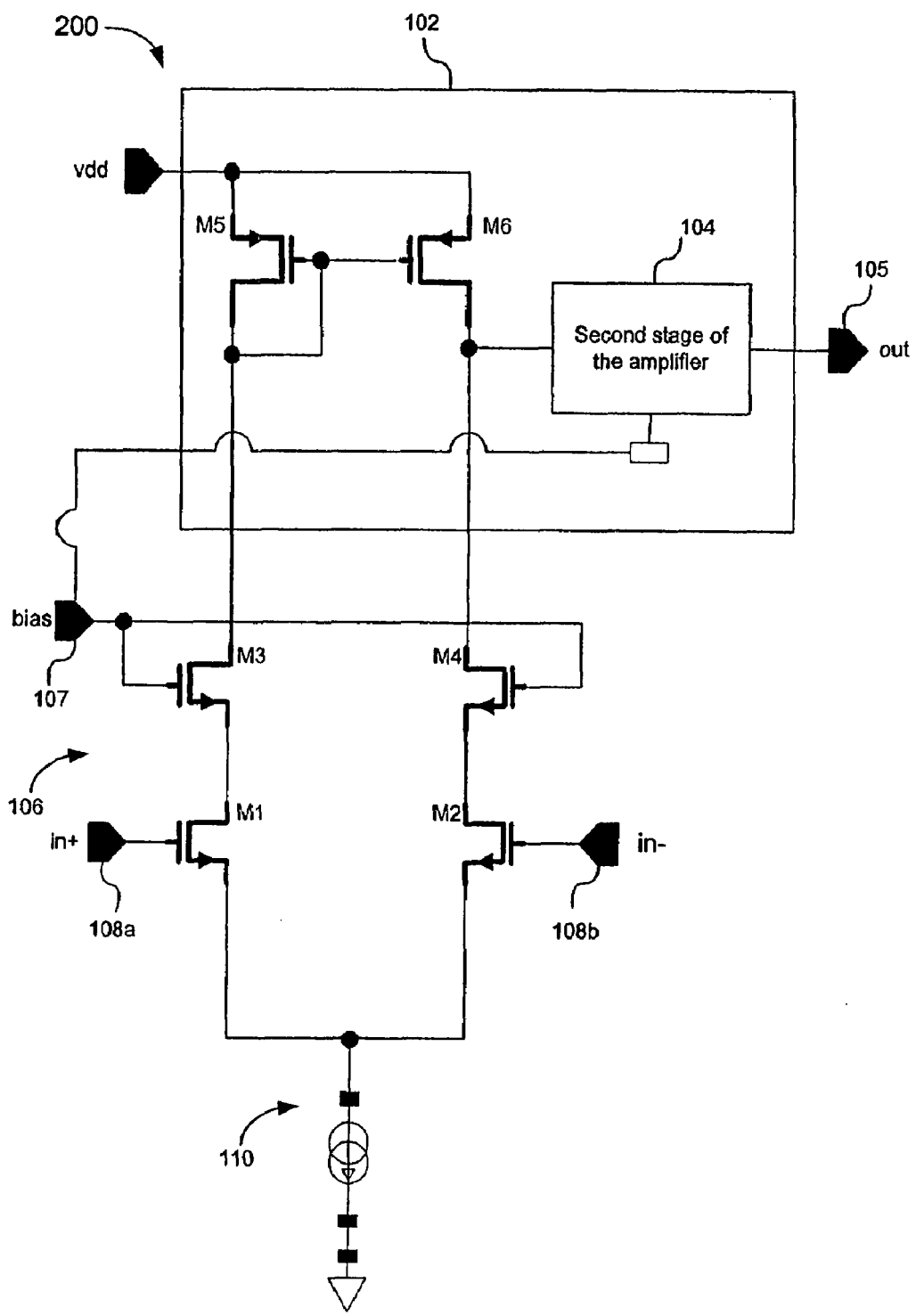
FIG. 2 illustrates a differential amplifier in a cascode configuration where the cascode devices are biased using the second stage amplifier according to embodiments of the present invention.
Figure 3:
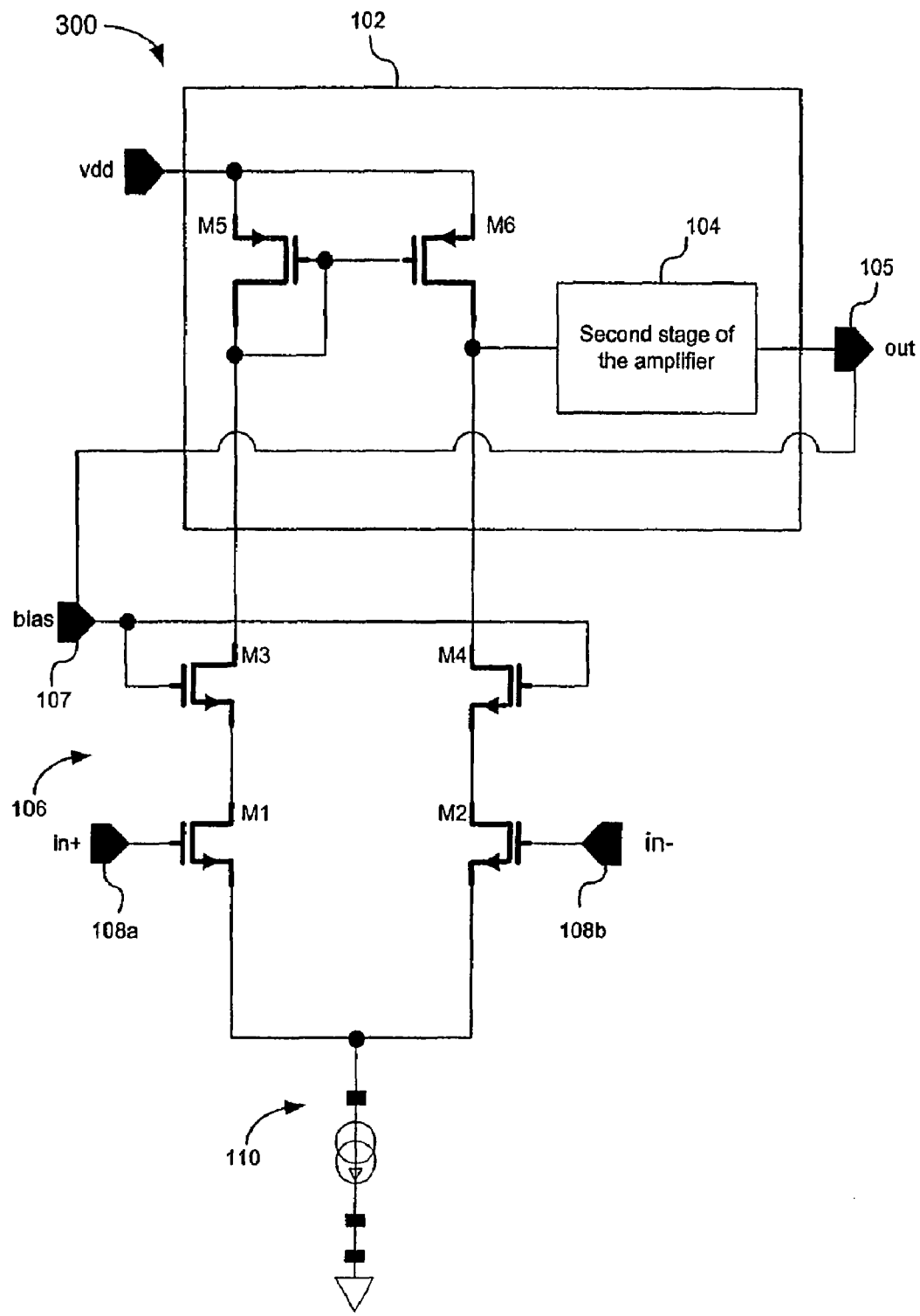
FIG. 3 illustrates a differential amplifier in a cascode configuration where the cascode devices are biased using the output terminal of the output circuit according to embodiments of the present invention.

For example, FIG. 2 illustrates that the second stage amplifier 104 generates a DC voltage that is connected to the bias terminal 107 to bias the cascode devices M3 and M4. In other words, the second stage amplifier 104 generates a fixed voltage at node 109 that is sufficient to bias the cascode devices M3 and M4 into the saturation region. FIG. 3 illustrates that the output terminal 105 generates a fixed DC voltage that is sufficient to bias the cascode devices M3 and M4 into the saturation region. It is noted that M3 and M4 are FET devices that draw no current at their respective gates.

Still referring to FIGS. 2 and 3, connecting the output 105 to the input of the differential amplifier 106 would normally cause stability concerns. However, stability concerns are mitigated since the gates of M3 and M4 are tied together so that only a common mode voltage is fed back. In other words, M3 and M4 are configured for differential amplification. However, no differential signal is fed-back for amplification. Furthermore, the impedance seen by the sources of M3 and M4 is relatively large due to the respective drain impedances of M1 and M2. Therefore, the voltage at the bias terminal 107 is primarily dropped across the source impedance seen at the sources of M3 and M4, causing the gain from gate-to-drain of M3 and M4 to be minimal.

Figure 4:
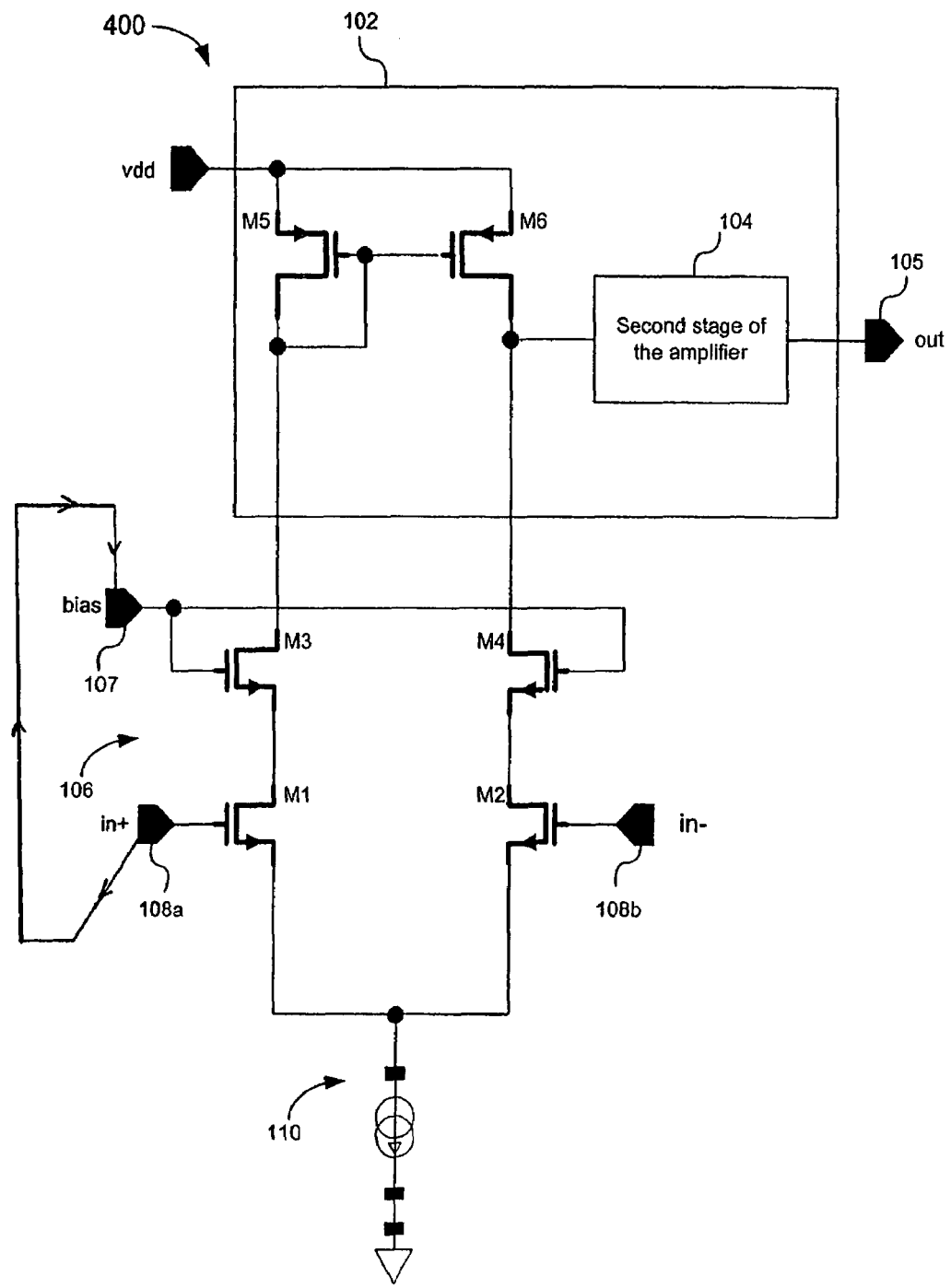
FIG. 4 illustrates a differential amplifier in a cascode configuration where the cascode devices are biased using the input terminals.

FIG. 4 illustrates that the input terminals 108a and 108b generate sufficient voltage to bias the transistors M3 and M4, provided that M3 and M4 are low threshold devices. In other words, the input signals at the input terminals 108a and 108b have a DC component sufficient to bias low threshold devices. In another embodiment, the DC component of the input signals is higher so that conventional FETs can be biased with the input terminals 108a and 108b.

Figure 5:
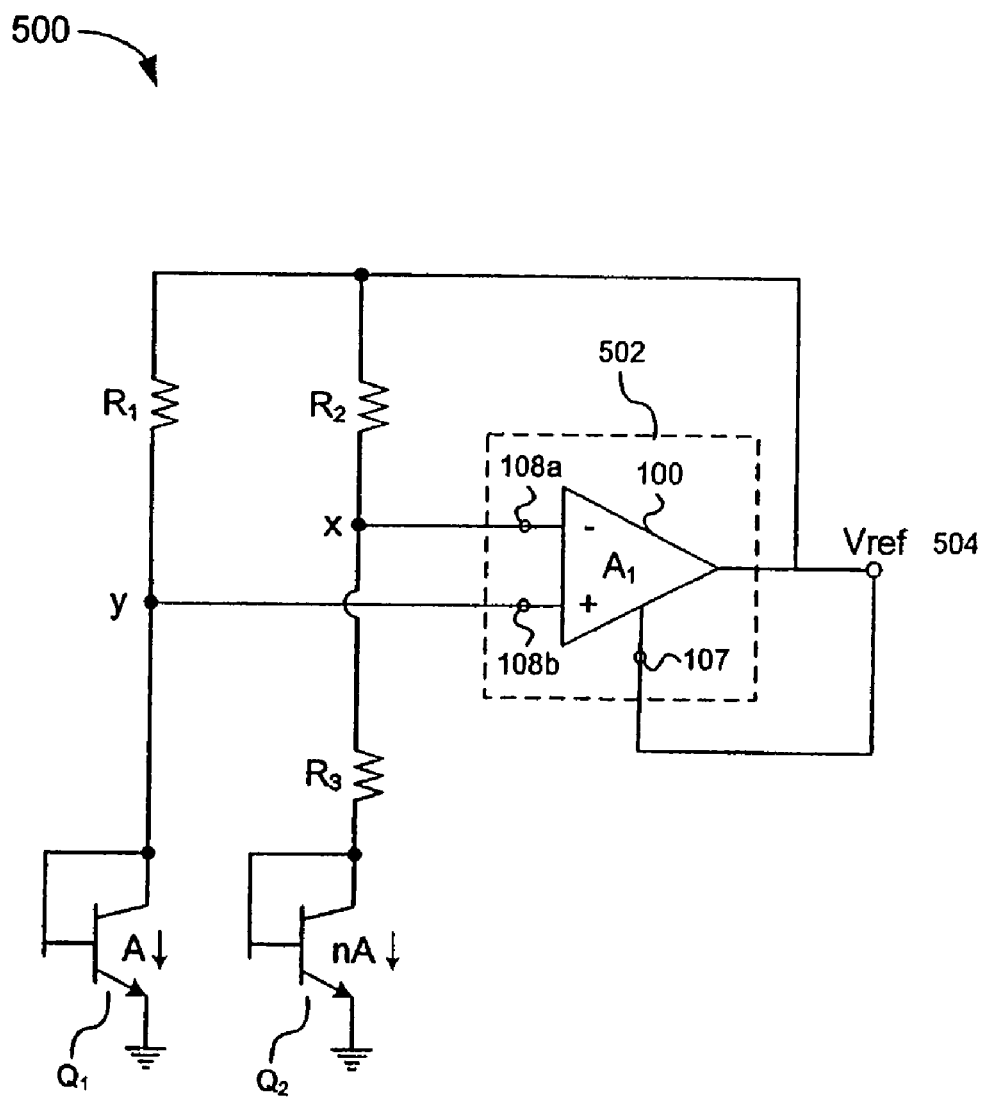
FIG. 5 illustrates a bandgap circuit that includes a differential amplifier with self-biased cascode devices according to embodiments of the present invention.

FIG. 5 illustrates an embodiment, where the circuit 100 is implemented in a voltage reference circuit 500 that generates a stable output voltage $V_{ref}$ 504. $V_{ref}$ 504 is stable and is sufficient to put the cascode devices M3 and M4 into saturation, and therefore can be used to bias the cascode devices M3 and M4 as discussed below.

Bandgap circuit 500 includes: resistors $R_1$, $R_2$, and $R_3$; diode connected bi-polar transistors $Q_1$ and $Q_2$; and an amplifier 502. The bandgap circuit 500 generally operates as follows. The diodes $Q_1$ and $Q_2$ are sized to conduct a relative current of 1:n, as shown in FIG. 5. The op amp 502 senses the voltages at nodes X and Y and drives $R_1$ and $R_2$ so that $V_X=V_Y$. Given these conditions and if $R_1=R_2$, it can be shown that $V_{BE1}-V_{BE2}=V_T \ln n$ where $V_{BE}$ is the base-emitter voltage. This forces a current through $R_3$ that is equal to $V_T \ln(n)/R_3$, where $V_T$ is the threshold voltage of diodes $Q_1$ and $Q_2$. This results in an output voltage of:

$$V_{ref}=V_{BE2}+(V_T \ln n)(1+R_2/R_3).$$

As a result, $V_{ref}$ 504 is relatively stable, and the voltage amplitude is determined by the current and device ratio n, and by the ratio of $R_2/R_3$. Bandgap circuits are further described in *Design of Analog CMOS Integrated Circuits*, Behzad Razavi, McGraw Hill, 2001, which is incorporated herein by reference in its entirety.

Still referring to FIG. 5, the amplifier 502 is configured using the differential amplifier configuration 100 of FIG. 1, where the input terminals 108a and 108b are connected to the nodes X and Y, and the $V_{ref}$ output 504 is taken from the output 105 of the second stage amplifier 104. Since $V_{ref}$ 504 is sufficiently stable, it can be connected to the bias terminal 107 and used to bias the cascode devices M3 and M4. Accordingly, there is no explicit or extra bias circuit that is needed to bias the gates of the cascode devices M3 and M4, since the bandgap output $V_{ref}$ is actually used to the provide the gate bias. Thus, there is significant savings in die area and power by eliminating the extraneous bias circuit for the cascode devices.

Figure 6:
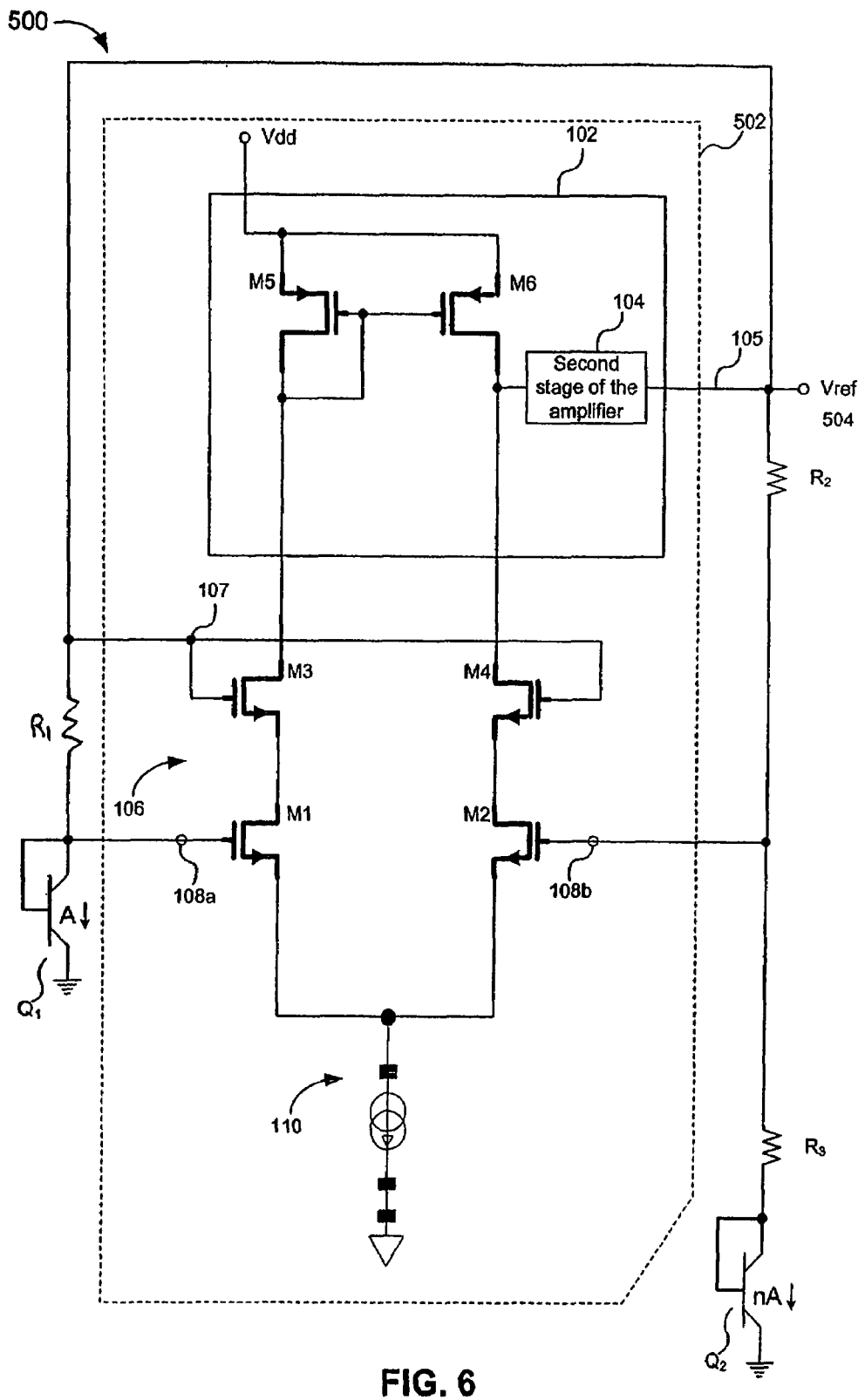
FIG. 6 further illustrates bandgap circuit of FIG. 5 according to embodiments of the present invention.

FIG. 6 provides a more explicit illustration of the bandgap circuit 500 having the differential amplifier 100 from FIG. 1. Again, as discussed above, the $V_{ref}$ 504 is a stable voltage reference that is used to bias the cascode devices M3 and M4 that are part of the input differential amplifier 106, which obviates the need for a separate cascode bias circuit.

Referring to FIG. 2-6, any of the nodes or terminals in the output circuit or elsewhere can provide the DC voltage to bias the cascode devices M3 and M4, as long as the bias voltage is sufficient to put the transistors M3 and M4 into saturation. The choices shown in FIGS. 2-6 are only examples. Those skilled in arts will recognize that other nodes could be used to provide the bias voltage and these other configurations are also within the scope and spirit of the present invention.

The differential amplifier configurations in FIGS. 1-6 can be implemented in any type of CMOS process or other processes. The differential amplifiers can be implemented in bipolar processes if the base current needs of the bipolar transistors are considered and accommodated.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A differential amplifier, comprising:
   a differential input receiving a differential input signal;
   a differential pair of transistors having respective gates coupled to said differential input;
   a cascode pair of transistors connected to respective drains of said differential pair of transistors, and having respective gates connected together and connected to one component of said differential input; and
   an output circuit connected to respective drains of said cascode pair of transistors;
   wherein said differential input signal provides a DC bias voltage for said gates of said cascode pair of transistors.

2. The differential amplifier of claim 1, wherein said cascode pair of transistor are low threshold devices, said DC bias voltage sufficient to operate said cascode pair of transistors in a saturation region.

3. The differential amplifier of claim 1, wherein said cascode pair of transistors are field effect transistors.

4. A bandgap circuit that generates a reference voltage, comprising:
   first and second bipolar transistors that are sized so as to conduct proportional collector currents;

a differential amplifier having a differential input that senses first and second voltages at nodes coupled to respective collectors of said first and second bipolar transistors, and producing said reference voltage so that said first and second voltages are substantially equal;

said differential amplifier including a differential pair of transistors having gates coupled to said first and second voltages; and a cascode pair of transistors having sources coupled to drains of said differential pair of transistors, and having gates connected to together and biased by said reference voltage.

5. A differential amplifier, comprising:

a differential input receiving a differential input signal;

a first pair of transistors for receiving said differential input signal;

a second pair of transistors coupled to said first pair of transistors, and having respective gates connected to one component of said differential input; and an output circuit connected to said second pair of transistors;

wherein said differential input signal provides a bias voltage for said second pair of transistors.

* * * * *

UNITED STATES PATENT AND TRADEMARK OFFICE
CERTIFICATE OF CORRECTION

PATENT NO.         : 7,459,976 B2                                            Page 1 of 1
APPLICATION NO. : 11/889992
DATED              : December 2, 2008
INVENTOR(S)        : Alireza Zolfaghari It is certified that error appears in the above-identified patent and that said Letters Patent is hereby corrected as shown below:

Column 5, line 12, please replace "connected to together" with --connected together--.

Signed and Sealed this

Third Day of March, 2009

JOHN DOLL
*Acting Director of the United States Patent and Trademark Office*